(12) United States Patent
Sato et al.

(10) Patent No.: US 8,598,701 B2
(45) Date of Patent: Dec. 3, 2013

(54) SEMICONDUCTOR DEVICE

(75) Inventors: Keisuke Sato, Kyoto (JP); Kouji Takemura, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/421,000

(22) Filed: Mar. 15, 2012

(65) Prior Publication Data

US 2012/0168930 A1 Jul. 5, 2012

Related U.S. Application Data

(63) Continuation of application No. PCT/JP2010/007201, filed on Dec. 10, 2010.

(30) Foreign Application Priority Data

Dec. 14, 2009 (JP) ................................. 2009-283175
Feb. 3, 2010 (JP) ................................. 2010-022332

(51) Int. Cl.
*H01L 23/10* (2006.01)

(52) U.S. Cl.
USPC .... 257/706; 257/707; 257/710; 257/E23.051; 257/E23.08

(58) Field of Classification Search
USPC ......... 257/675, 706, 276, 625, 707, 712–722, 257/796, E33.075, E31.131, E23.051, 257/E23.08–E23.113
See application file for complete search history.

(56) References Cited

U.S. PATENT DOCUMENTS

| 6,225,694 | B1 | 5/2001 | Terui |
| 2001/0008301 | A1 | 7/2001 | Terui |
| 2007/0045798 | A1 | 3/2007 | Horie et al. |
| 2011/0001225 | A1* | 1/2011 | Ohtani .......................... 257/675 |

FOREIGN PATENT DOCUMENTS

| JP | 11-145333 | 5/1999 |
| JP | 11-176980 | 7/1999 |
| JP | 2001-196512 | 7/2001 |
| JP | 2001-338999 | 12/2001 |
| JP | 2005-136220 | 5/2005 |
| JP | 2007-42719 | 2/2007 |
| JP | 2009-231554 | 10/2009 |

OTHER PUBLICATIONS

International Search Report of PCT Application No. PCT/JP2010/007201 dated Jan. 11, 2011.

* cited by examiner

*Primary Examiner* — Jasmine Clark
(74) *Attorney, Agent, or Firm* — Panasonic Patent Center

(57) ABSTRACT

A semiconductor device has high reliability which suppresses a temperature rise of a set housing within an allowable range, and avoids an effect on a wiring on a package substrate due to thermal expansion of a heat dissipating member. The semiconductor device includes a semiconductor element, a package substrate, and a heat dissipating member. A first main surface of the semiconductor element faces an element-mounting surface of the package substrate and is connected to the package substrate. A main surface part of the heat dissipating member contacts a second main surface which is a back surface of first main surface of semiconductor element. A bonding part around a periphery of the main surface part is bonded to a bonding area of the element-mounting surface of the package substrate. A wiring on the package substrate is arranged at a portion other than the element-mounting surface, in a region of the bonding area.

20 Claims, 11 Drawing Sheets

SEMICONDUCTOR DEVICE

TECHNICAL FIELD

The present invention relates to a semiconductor device including a semiconductor element mounted onto a package substrate and a heat dissipating member for dissipating heat generated from the semiconductor element to an outside.

BACKGROUND ART

As a recent electronic device becomes multifunctional, smaller, and thinner, a semiconductor device including a semiconductor element onto a package substrate serving as a wiring substrate is required to have a higher density, to be smaller, and to be thinner. As a semiconductor device attaining such purposes, a semiconductor device provided by flip chip bonding is widely used, in which plural bump electrodes formed on one main surface of the semiconductor element are electrically connected to connection electrodes of the package substrate formed at positions corresponding to the bump electrodes so as to overlap each other.

A semiconductor device connected by a flip chip bonding has a heat dissipating plate serving as a heat dissipating member which dissipates heat generated from the semiconductor element to an outside. For example, Patent Literature 1 discloses a semiconductor device using flip chip bonding. This semiconductor device includes a heat dissipating plate bonded to a semiconductor element with an adhesive layer made of a porous ceramic plate impregnated with a thermosetting resin, and also bonded to a package substrate through a ring surrounding the semiconductor element.

The flip-chip bonded semiconductor device disclosed in Patent Literature 1 has both high heat dissipating characteristics and mounting reliability. However, particularly in a mobile electronic device, when a large amount of heat is generated by the semiconductor element transmitted through the heat dissipating plate and a heat-conductive material, a temperature rises over an allowable level of a housing of the electronic device since the electronic device has a small size, thus providing a problem.

In the case that a temperature of the heat dissipating plate rises, a crack may be produced in a wiring formed on the package substrate and an external electrode used for connecting a mount substrate, such as a mother board, on which the package substrate is to be mounted, a resistance value rises, and a physical fracture is generated, hence providing another problem that a desired electric connection cannot be obtained.

CITATION LIST

Patent Literature

Patent Literature 1: Japanese Patent Laid-Open Publication No. 2001-196512

SUMMARY OF THE INVENTION

A semiconductor device to solve the above problems includes a semiconductor element, a package substrate, and a heat dissipating member. The semiconductor element is connected to the package substrate, such that a first main surface of the semiconductor element faces an element-mounting surface of the package substrate. A main surface part of the heat dissipating member contacts a second main surface of the semiconductor element corresponding to a surface opposite to the first main surface of the semiconductor element. A bonding part around a periphery of the heat dissipating member is bonded to a bonding area of the element-mounting surface of the package substrate. A wiring on the package substrate is arranged at a portion other than the element-mounting surface, in the bonding area.

In the semiconductor device according to the present invention, the wiring in the package substrate is arranged at the portion other than the element-mounting surface, in the bonding area. Therefore, even when the heat dissipating member thermally expands due to a temperature rise, and a stress is applied to the package substrate, electric conduction of the wiring on the package substrate is prevented from being damaged.

DETAIL DESCRIPTION OF PREFERRED EMBODIMENTS

A semiconductor device according to an aspect of the invention includes a semiconductor element, a package substrate, and a heat dissipating member. The semiconductor element has a first main surface and a second main surface which is a back surface opposite to the first main surface. The package substrate has an element-mounting surface. The heat dissipating member includes a main surface part and a bonding part provided at an outer periphery of the main surface part. A wiring is provided on the package substrate. The semiconductor element is connected to the package substrate, such that the first main surface of the semiconductor element faces the element-mounting surface of the package substrate. The bonding part of the heat dissipating member adheres to a portion of a bonding area of the element-mounting surface of the package substrate. The wiring is arranged at a portion of the package substrate other than the element-mounting surface of the package substrate, within the bonding area.

In to the semiconductor device, the wiring can be arranged so as to avoid the portion of the bonding area having a stress directly acts thereon when the heat dissipating member thermally expands, so that an electric bonding defect, such as an increase of a resistance of the wiring or physical fracture caused when the wiring is cracked can be effectively prevented from being generated.

The semiconductor device according to the present invention will be described below with reference to the drawings.

Each figure referred to below only shows simply essential members of the semiconductor device according to the present invention for descriptive convenience. Therefore, the semiconductor device according to the present invention may be provided with a component member not shown in each figure referred to. In addition, the dimension of each member in each figure does not accurately indicate the dimension of an actual component and a dimensional ratio of each member.

First Exemplary Embodiment

Figure 1:
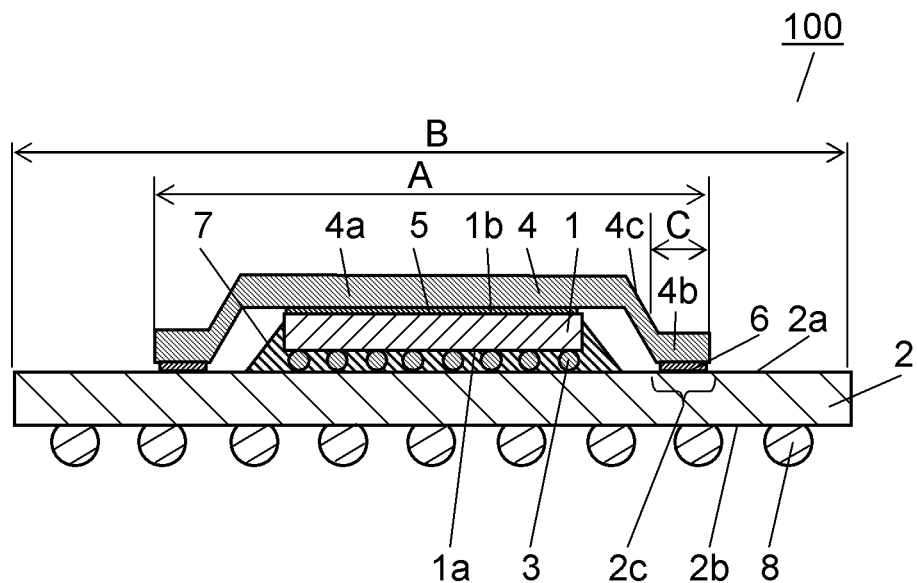
FIG. 1 is a schematic cross-sectional view of a semiconductor device according to a first exemplary embodiment of the present invention.

FIG. 1 is a schematic cross-sectional view of a semiconductor device according to a first exemplary embodiment of the present invention.

As shown in FIG. 1, semiconductor device 100 according to this embodiment has a flip chip configuration. Plural bump electrodes 3 formed on first main surface 1a of semiconductor element 1 are connected with connection electrodes. The connection electrodes which are not shown in FIG. 1 are formed on element-mounting surface 2a of package substrate 2 serving as a circuit substrate to have semiconductor element 1 mounted thereto. The connection electrodes are located at positions corresponding to the bump electrodes 3.

Package substrate 2 is preferably made of a substrate material which is not likely to expand or contract when semiconductor element 1 is connected by flip chip bonding with heat. Preferable substrate materials include a multilayer ceramic substrate, a glass cloth laminated epoxy substrate (glass-epoxy substrate), an aramid unwoven substrate, and a glass cloth laminated polyimide resin substrate.

Bump electrode 3 may be made of a solder bump in general, but may be made of an Au stud bump based on a wire bonding technique, a bump formed of a metal other than Au, or a ball or land other than the bump. The solder bump may be formed by a plating method, a printing method, or a microball mounting method.

The flip-chip bonded semiconductor device disclosed in Patent Literature 1 has both high heat dissipating characteristics and mounting reliability. However, particularly in a mobile electronic device, when a large amount of heat is generated by the semiconductor element transmitted through the heat dissipating plate and a heat-conductive material, a temperature rises over an allowable level of a housing of the electronic device since the electronic device has a small size, thus providing a problem.

In the case that a temperature of the heat dissipating plate rises and thermal expansion is generated, a large stress is applied to a portion bonding the heat dissipating plate to the package substrate. This stress may produce a crack in a wiring formed on the package substrate and an external electrode used for connecting a mount substrate, such as a mother board, on which the package substrate is to be mounted, a resistance value rises, and a physical fracture is generated, hence providing another problem that a desired electric connection cannot be obtained.

In semiconductor device 100 according to this embodiment, heat dissipating plate 4 serving as a heat dissipating member is disposed on package substrate 2 so as to cover semiconductor element 1 while keeping heat conduction from semiconductor element 1 bonded by flip chip bonding. That is, as shown in FIG. 1, main surface part 4a of heat dissipating plate 4 is connected via heat dissipating paste 5 to second main surface 1b which is a back surface opposite to first main surface 1a of semiconductor element 1. Heat dissipating paste 5 serves as a thermally-conductive member having high thermal conductivity. Bonding part 4b positioned around an outer periphery of heat dissipating plate 4 projects toward package substrate 2 to surround semiconductor element 1, and is bonded to bonding area 2c of element-mounting surface 2a of package substrate 2 with adhesive agent 6.

The heat dissipating member used in semiconductor device 100 according to this embodiment is heat dissipating plate 4 having a plate shape, main surface part 4a and bonding part 4b are connected with slope part 4c which forms predetermined angles with main surface part 4a and bonding part 4b so that semiconductor element 1 is accommodated in an inside of heat dissipating plate 4. Heat dissipating plate 4 is preferably made of a metal, such as Cu, Al, or AlSiC, having high heat conductivity and superior heat dissipating performance.

Insulating resin 7 so called an underfill resin is provided on first main surface 1a facing element-mounting surface 2a of package substrate 2 to fill and cover a part in which bump electrode 3 is not formed, and a vicinity of semiconductor element 1 provided by flip chip bonding. Resin 7 known as the underfill resin is made of, e.g., thermosetting liquid resin, and preferably contains inorganic filler, such as silica. Resin 7 preferably has heat resistance which can offer resistance to a high temperature in a subsequent reflow step. The thermosetting liquid resin may be preferably an epoxy resin.

External electrodes 8 to bond semiconductor device 100 to a mount substrate serving as an external circuit substrate, such as a mother board, are formed on surface 2b opposite to element-mounting surface 2a of package substrate 2 in a regular pattern, such as a matrix aligned in longitudinal and lateral directions. External electrode 8 is formed as a solder ball in general, but it may be a ball made of a metal other than solder or a member, such as a land or a bump, which does not have the ball shape.

Figure 2:
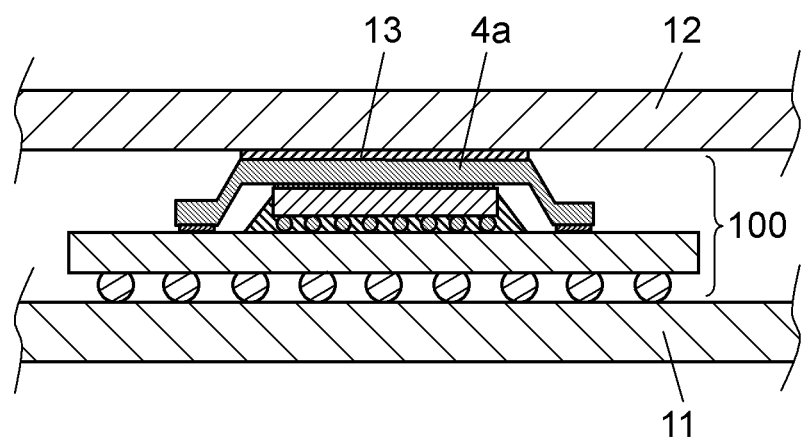
FIG. 2 is a schematic cross-sectional view of the semiconductor device according to the first embodiment of the invention, for illustrating a structure of the connection with a mount substrate and a set housing.

FIG. 2 illustrates semiconductor device 100 according to this embodiment mounted on mount substrate 11 serving as the external circuit substrate as an actually used connection state, in which main surface part 4a of heat dissipating plate 4 contacts set metal housing 12 via thermally-conductive heat dissipating paste 13.

In semiconductor device 100 according to this embodiment, in plan view of element-mounting surface 2a of package substrate 2, that is, when the cross-sectional structure shown in FIG. 1 is looked down from above the figure, the surface area of heat dissipating plate 4 ranges from 41% to 64% of the surface area of package substrate 2. For example, in the case that the shape of package substrate 2 and the shape of heat dissipating plate 4 are both substantially a square shape in plan view, length A of one side of heat dissipating plate 4 shown in FIG. 1 and length B of one side of package substrate 2 satisfy the relation that A/B ranges roughly from 0.64 to 0.8.

Thus, the relation that the area of heat dissipating plate 4 ranges from 41 to 64% when of the area of package substrate 2 in a plan view of element-mounting surface 2a of package substrate 2, the amount of heat transmitting to set housing 12 through heat dissipating plate 4 of heat generated from semiconductor element 1 at the time of an operation of semiconductor element 1 can be kept under a certain level while a temperature rise of semiconductor element 1 can be kept within a range which does not affect the operation.

As an example of the set having semiconductor device 100 mounted thereto, an ordinary Blu-ray disk recorder housing is assumed.

Based on a result of a thermo-fluid analysis under a usage environment of the ordinary Blu-ray disk recorder, a study is made in the case that an amount of heat generation of semiconductor element 1 is equal to an amount of heat generation of an image processing engine LSI of the Blu-ray disk recorder at the time of maximum power consumption. In the case that the surface area of package substrate 2 is 1225 mm$^2$ (a square shape having sides of 35 mm), and the area of heat dissipating plate 4 in plan view is 506.25 mm$^2$ (a square shape having sides of 22.5 mm), a heat dissipating amount from semiconductor element 1 is limited, and a temperature of semiconductor element 1 reaches Tj(max) which is an operation limit of semiconductor element 1. Therefore, it is found that the ratio of the area of heat dissipating plate 4 to the area of package substrate 2 needs to be 41% or more to ensure a normal operation of semiconductor element 1.

In a case that the area of heat dissipating plate 4 in plan view is 784 mm$^2$ (a square shape having sides of 28 mm), the heat dissipating amount from semiconductor element 1 to set Blu-ray recorder housing 12 through heat dissipating plate 4 increases, and the temperature reaches Tc(max) which is a surface temperature limit of Blu-ray recorder housing 12. That is, when the ratio of the area of heat dissipating plate 4 to the area of package substrate 2 exceeds 64%, heat conduction to set housing 12 with heat dissipating plate 4 used as a heat conduction path becomes too much, and it exceeds a temperature specification of the set housing.

As described above, the ratios of the area of heat dissipating plate 4 to the area of package substrate 2 ranges preferably from 41% to 64% in plan view of element-mounting surface 2a of package substrate 2.

In semiconductor device 100 according to this embodiment, width C of bonding part 4b of heat dissipating plate 4 bonded to bonding area 2c of package substrate 2 ranges preferably from 1 mm to 3 mm. In this case, package substrate 2 and heat dissipating plate 4 can be bonded to each other with predetermined strength, and a wiring pattern (not shown in FIG. 1 or 2) which is formed on element-mounting surface 2a of package substrate 2 can be effectively prevented from being cracked or removed by a stress applied to bonding area 2c due to a difference in thermal expansion coefficient between heat dissipating plate 4 and package substrate 2. Therefore, highly reliable package substrate 2 can be provided without generating a problem of a rise in resistance value or a connection defect of a wiring formed on element-mounting surface 2a.

Second Exemplary Embodiment

A semiconductor device according to a second exemplary embodiment will be described with reference to FIGS. 3 and 4. A configuration example of the device can further reduce damage to the wiring formed on element-mounting surface 2a of package substrate 2, by the stress applied to package substrate 2 due to the difference in thermal expansion coefficient between heat dissipating plate 4 and package substrate 2.

Figure 3:
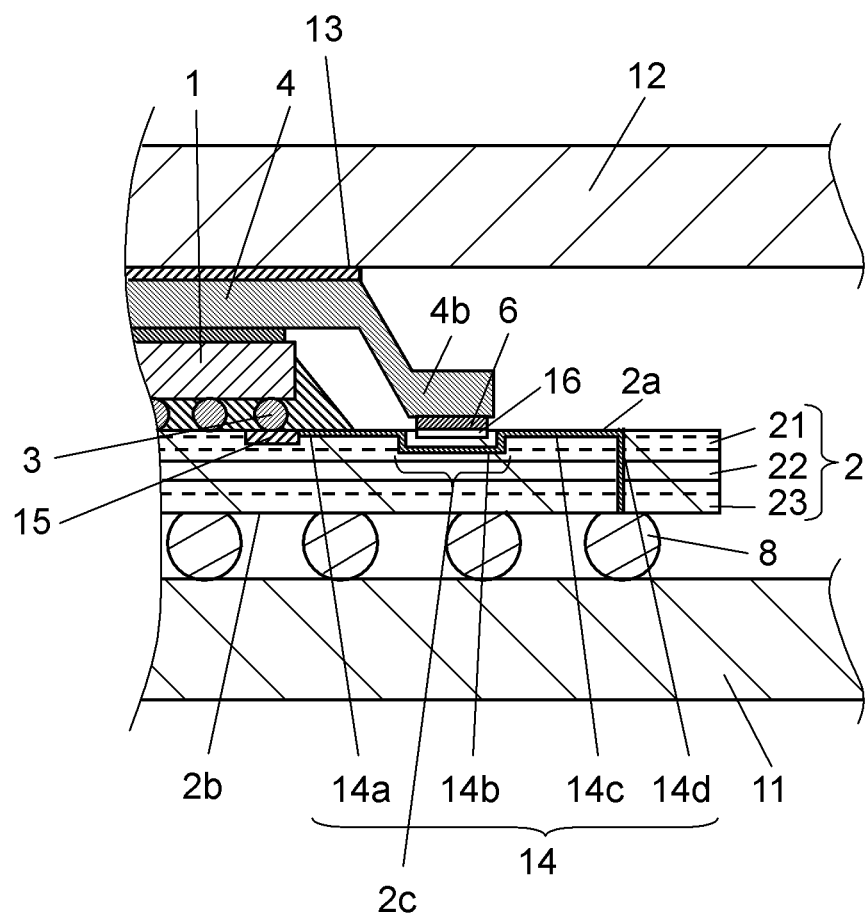
FIG. 3 is a schematic cross-sectional view of a semiconductor device according to a second exemplary embodiment of the invention for illustrating a first arrangement example of a wiring near a bonding area of a package substrate.

FIG. 3 is a partially enlarged cross-sectional view of the semiconductor device according to this exemplary embodiment for showing the bonding part between bonding area 2c of package substrate 2 and bonding part 4b around heat dissipating plate 4.

As shown in FIG. 3, wiring 14 connected to connection electrode 15 is formed on element-mounting surface 2a of package substrate 2 and is connected to bump electrode 3 of semiconductor element 1. Wiring 14 includes wiring 14a serving as a surface wiring formed on a surface of element-mounting surface 2a of package substrate 2 extends from connection electrode 15 to a vicinity of bonding area 2c. Wiring 14 includes internal wiring 14b formed inside package substrate 2 in bonding area 2c to bypass bonding area 2c. Furthermore, wiring 14 includes wiring 14c serving as a surface wiring formed on element-mounting surface 2a of package substrate 2 after bonding area 2c. External electrode 8 is formed on surface 2b of package substrate 2 opposite to element-mounting surface 2a. Wiring 14c is connected to external electrode 8 through penetration hole part 14d, such as a via hole, provided in package substrate 2.

Thus, since bonding part 4b of heat dissipating plate 4 is bonded with adhesive agent 6, a stress is generated due to the difference in thermal expansion amount when heat dissipating plate 4 having a thermal expansion coefficient higher than that of package substrate 2 thermally expands, and the stress concentrates in bonding area 2c of element-mounting surface 2a. Since wiring 14 of package substrate 2 bypasses bonding area 2a, wiring 14 can be prevented from having a crack therein generating an electric connection defect.

In the device shown in FIG. 3, metal solid pattern 16 is formed on the part of the substrate where the wiring 14 bypasses bonding area 2c through internal wiring 14b formed inside package substrate 2. Metal solid pattern 16 is insulated from surface wirings 14a and 14c with a predetermined distance, so that metal solid pattern 16 can be formed simultaneously to wirings 14a and 14c as a metal pattern in the same layer as wirings 14a and 14c.

Metal solid pattern 16 is formed on bonding area 2c can absorb the stress applied to element-mounting surface 2a of package substrate 2 from adhesive agent 6 which bonds heat dissipating plate 4, providing an effect that prevents wiring 14 on package substrate 2 from having a crack.

Figure 4:
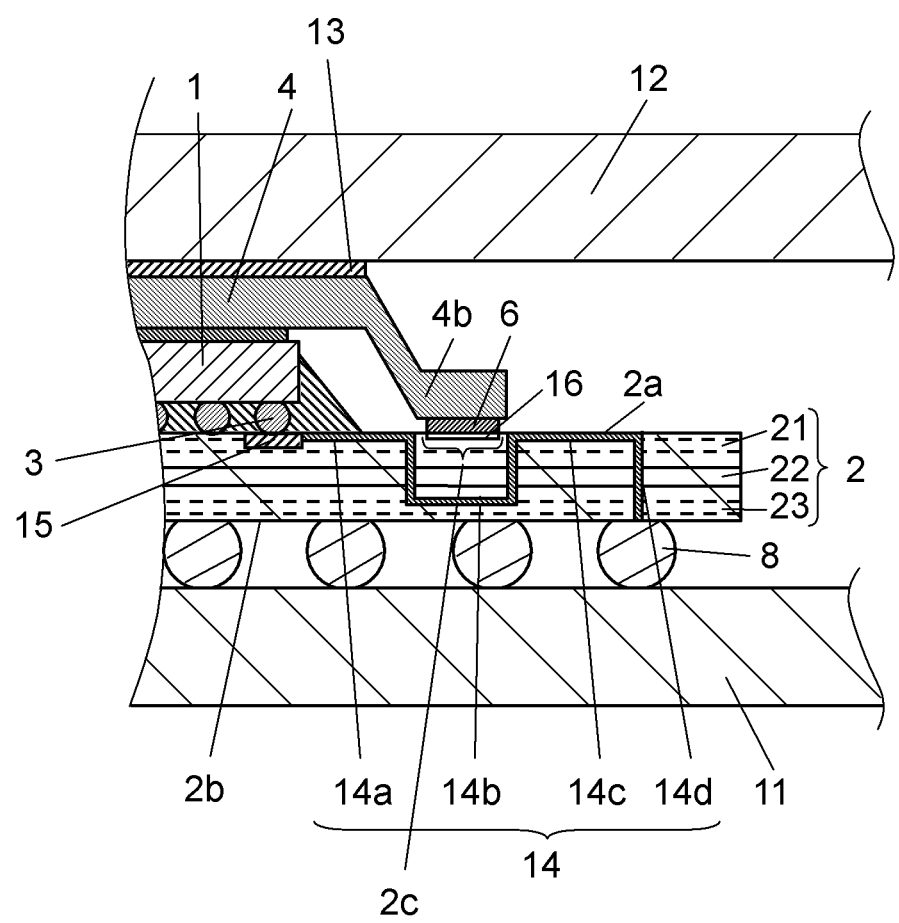
FIG. 4 is a schematic cross-sectional view of the semiconductor device according to the second embodiment of the invention for illustrating a second arrangement example of a wiring near the bonding area of the package substrate.

FIG. 4 is a partial enlarged cross-sectional view of the device for showing another configuration to avoid an influence of the stress applied to wiring 14 formed on element-mounting surface 2a of package substrate 2 due to the thermal expansion of heat dissipating plate 4.

The configuration shown in FIG. 4 is different from the configuration shown in FIG. 3 in the position of internal wiring 14b provided in package substrate 2 to bypass bonding area 2c of package substrate 2. That is, in the configuration shown in FIG. 3, internal wiring 14b is formed inside upper layer 21 which is located towards element-mounting surface 2a from base material 22 of package substrate 2. In the configuration shown in FIG. 4, internal wiring 14b bypassing bonding area 2c is formed inside lower layer 23 which is located towards surface 2b opposite to element-mounting surface 2a. Internal wiring 14b passes through base material 22 of package substrate 2 to be connected to wirings 14a and 14c formed on element-mounting surface 2a.

Thus, in the case that base material 22 having high mechanical strength to suppress an overall warpage amount is sandwiched by upper layer 21 and lower layer 23 in package substrate 2, internal wiring 14b is formed in lower layer 23 which is deeper than base material 22 having the high mechanical strength, and reduces the effect on internal wiring 14b due to the stress applied to the surface of element-mounting surface 2a of package substrate 2. Therefore, wiring 14 is effectively prevented from being cracked, and provides package substrate 2 with high reliability.

A preferable condition to avoid the effect of the stress due to the thermal expansion of heat dissipating plate 4 applied to wiring 14 will be described below in which wiring 14 bypasses bonding area 2c through internal wiring 14b formed inside package substrate 2, in bonding area 2c of package substrate 2.

In considerations shown in FIGS. 5 and 6, a description will be made based on an end position of adhesive agent 6 to bond heat dissipating plate 4 to package substrate 2, in order to precisely discuss the effect on the wiring formed in package substrate 2 due to the stress applied due to the thermal expansion of heat dissipating plate 4. Meanwhile, bonding area 2c of package substrate 2 in this specification is used as a term corresponding to bonding part 4b of heat dissipating plate 4. Bonding part 4b is larger than a region to which adhesive agent 6 is actually applied.

Figure 5:
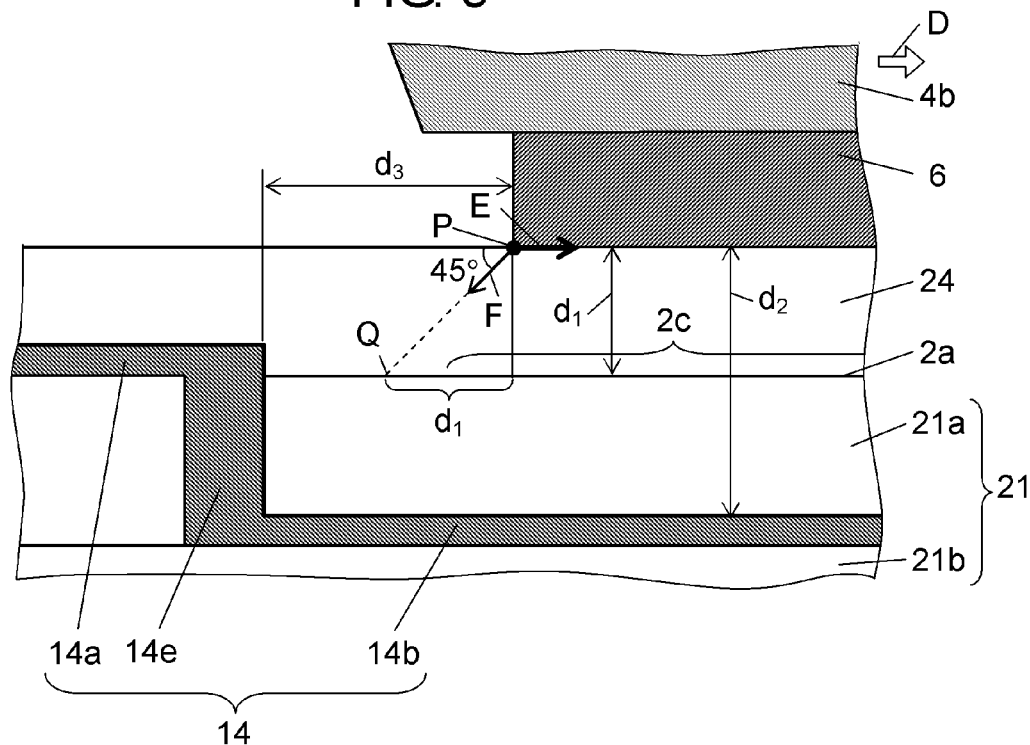
FIG. 5 is an enlarged cross-sectional view of the bonding area of the package substrate.

FIG. 5 is an enlarged cross-sectional view of the semiconductor device according to this embodiment for showing an enlarged bonding part between package substrate 2 and heat dissipating plate 4. FIG. 5 shows enlarged bonding area 2c which is the same part as shown in FIGS. 3 and 4, and semiconductor element 1 is mounted on the left side of FIG. 5 although not shown in FIG. 5.

As shown in FIG. 5, upper layer 21 of package substrate 2 of the semiconductor device according to this embodiment includes first layer substrate 21a and second layer substrate 21b. A surface of first layer substrate 21a corresponds to element-mounting surface 2a. Although not shown in FIG. 5, wiring 14a is connected to connection electrode 15 which is connected to bump electrode 3 of semiconductor element 1, and is formed on element-mounting surface 2a of package substrate 2. Thus, wiring 14 serves as a surface wiring of first layer substrate 21a.

Although not shown in FIG. 3, protective film 24 is formed on element-mounting surface 2a which is the surface of first layer substrate 21a. Protective film 24 covers wiring 14 in a part where wiring 14 is formed, and is formed directly on element-mounting surface 2a in a part where wiring 14 is not formed. Protective film 24 is made of a non-conductive resin, such as a resist film, and prevents wiring 14 on element-mounting surface 2a from being removed or broken due to a contact with an external member when package substrate 2 is treated. Although not shown in FIG. 5, an opening is formed in protective film 24 in a part corresponding to a terminal connected to an electronic circuit component mounted on package substrate 2, such as connection electrode 15 connected to bump electrode 3 of semiconductor element 1, so that the terminal part is exposed without being covered with protective film 24 to be surely connected to the electronic circuit component.

In bonding area 2c, wiring 14 connecting connection electrode 15 to external electrode 8 passes through the wiring formed on a surface of second layer substrate 21b, as internal wiring 14b provided inside the substrate. As shown in FIG. 5, the wiring formed on the surface of first layer substrate 21a as wiring 14a formed on element-mounting surface 2a, and the wiring formed on the surface of second layer substrate 21b as internal wiring 14b are connected by penetration wiring 14e which penetrates first layer substrate 21a. Thus, wirings 14a, 14b, and 14e constitute wiring 14 bypassing bonding area 2c.

As shown in FIG. 5, adhesive agent 6 bonds bonding part 4b of heat dissipating plate 4 to package substrate 2. Element-mounting surface 2a serves as the surface of first layer substrate 21a. Wiring 14a serves as the surface wiring formed on element-mounting surface 2a on the side of bonding area 2c. Distance d1 between adhesive agent 6 and element-mounting surface 2a, distance d2 between adhesive agent 6 and internal wiring 14b, and distance d3 between an end of wiring 14a on towards bonding area 2c and an end of adhesive agent 6 towards semiconductor element 1 preferably satisfy the following relation.

$$d2 > 2d1, \text{ and } d3 > \sqrt{3}d1 \quad \text{(Formula 1)}$$

More preferably, the distances may satisfy the following salvation.

$$d2 > \sqrt{5}d1, \text{ and } d3 > 2d1 \quad \text{(Formula 2)}$$

In the semiconductor device according to this embodiment, heat of semiconductor element 1 is transmitted to main surface part 4a and causes heat dissipating plate 4 to expand, so that bonding part 4b of heat dissipating plate 4 tends to move in a direction away from semiconductor element 1 denoted by white arrow D shown in FIG. 5, that is, in the right direction in FIG. 5. Adhesive agent 6 is pulled in white arrow direction D by the force with which bonding part 4b of heat dissipating plate 4 tends to move in white arrow direction D. Stress E acting in a right direction denoted by a black arrow shown in FIG. 5 is applied to a connection point between the end of the adhesive agent 6 towards semiconductor element 1 and package substrate 2, more specifically, connection point P with protective film 24 applied onto first layer substrate 21a. Stress E applies a shear stress to protective film 24 at point P. This shear stress becomes maximum in a lower left direction denoted by arrow F angled by 45 degrees from point P, shown in FIG. 5. Therefore, when wiring 14a formed on first layer substrate 21a is positioned towards adhesive agent 6 from a position intersecting with the direction of the maximum shear stress denoted by arrow F, that is, from point Q which is an intersecting point between the maximum shear stress F direction and the surface of the first layer substrate, wiring 14a may be broken.

As described above, distance d3 between the end of wiring 14a towards bonding area 2c and the end of adhesive agent 6 towards semiconductor element 1 may be larger than d1, and as a margin of safety to reduce a risk of fracture of wiring 14a to a certain level or lower, distance d3 may be preferably larger than √3d1, as expressed by formula 1.

Further, as expressed by formula 2, distance d3 may be larger than 2d1 to surely eliminate a possibility that wiring 14a is cut by the shear stress generated by stress E which pulls adhesive agent 6 in the right direction.

A preferable range of distance d2 between adhesive agent 6 and internal wiring 14b which corresponds to the position of internal wiring 14b in a depth direction may be determined based on the result of the study of distance d3 between the end of wiring 14a towards bonding area 2c and the end of adhesive agent 6 towards semiconductor element 1. More specifically, a distance between point P and a point on a surface of first layer substrate 21a which corresponds to a position providing distance d3 with a preferable value is found. Point P is the intersection point between the end of adhesive agent 6 towards semiconductor element 1 and the surface of protective film 24 applied to package substrate 2. Distance d2, upon being equal to or larger than the found distance reduces the possibility that the shear stress reaches and breaks inner wiring 14b. The distance between point P and the point of the surface of first layer substrate 21a corresponding to the position providing distance d3 with the preferable value is the length of the hypotenuse of a right triangle having a side of distance d3 and a side of distance d1. Hence, it is considered that in the case of $d3 > \sqrt{3}d1$ as shown in formula 1, distance d2 is larger than 2d1. In the case of $d3 > 2d1$ as shown in formula 2 as the more preferable condition, it is more preferable that d2 is larger than $\sqrt{5}d1$.

As described above, in the case that wiring 14 includes internal wiring 14b passing through package substrate 2 in bonding area 2c of package substrate 2 to which bonding part 4b of heat dissipating plate 4 is bonded with adhesive agent 6, as long as the relationship of formula 1 or 2 is satisfied, both internal wiring 4b and wiring 14a formed on element-mounting surface 2a can be effectively prevented from being cut due to the stress generated by the difference in thermal expansion coefficient between heat dissipating plate 4 and package substrate 2 which is caused when the heat generated from semiconductor element 1 is transmitted and heat dissipating plate 4 thermally expands.

As specific numeric values of the semiconductor device according to this embodiment, distance d1 is 20 μm as a thickness of the protective film formed on element-mounting surface 2a of first layer substrate 21a constituting package substrate 2. Distance d2 is 45 μm provided by adding, to distance d1, a value obtained by subtracting a thickness (e.g. 15 μm) of wiring 14b from a film thickness (e.g. 40 μm) of first layer substrate 21a. Distance d3 is 100 μm as the distance to the end of wiring 14a. In addition, since distance d3 is a value determined by a design of the wiring pattern on first layer substrate 21a, a desired value can be obtained easily. But the numeric value of distance d2 is substantially determined by the thickness of first layer substrate 21a since distance d1 is determined as the predetermined value, so that distance d2 is influenced by various elements on the design of package substrate 2 as the laminated substrate. Therefore, it is considered that distance d2 cannot always have a preferable value in the above condition of formula 1 or 2. But as long as the value of distance d3 only satisfies the above condition of formula 1 or 2, wiring 14a positioned on the upper layer which tends to have the stress applied thereto can be effectively prevented from being cut.

FIG. 5 shows the example in which penetration wiring 14e which penetrates first layer substrate 21a is formed in the end position of wiring 14a formed on element-mounting surface 2a, but this is not indispensable condition in semiconductor device 100 according to this embodiment. Penetration wiring 14e may be formed in a position slightly deviating from the end of wiring 14a towards semiconductor element 1.

Next, another condition to prevent the effect of the stress on the wiring 14 in the part of bonding area 2c of package substrate 2 of the semiconductor device according to this embodiment will be described with reference to FIG. 6.

Figure 6:
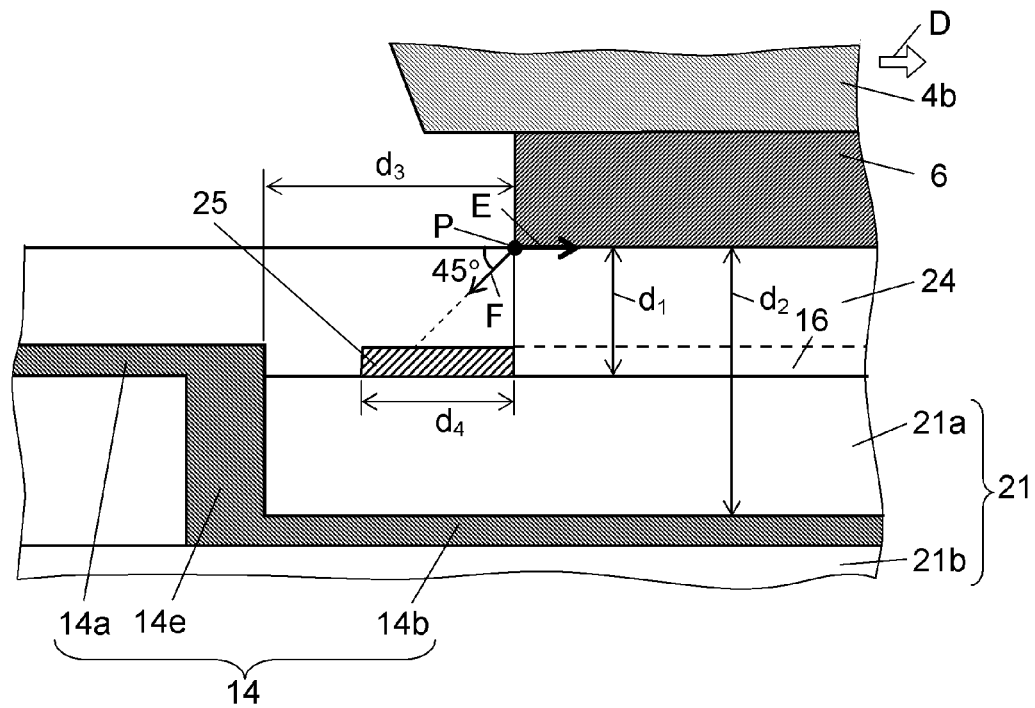
FIG. 6 is an enlarged cross-sectional view of another configuration of the bonding area of the package substrate.

FIG. 6 is a partial enlarged cross-sectional view of semiconductor element 1 for showing a part in the vicinity of the end of adhesive agent 6 bonding heat dissipating plate 4 to bonding area 2c of package substrate 2, similar to FIG. 5.

In the semiconductor device shown in FIG. 6, in the case that a crack is produced in protective film 24 from connection point P between the end of adhesive agent 6 towards semiconductor element 1 and protective film 24 applied onto first layer substrate 21a of package substrate 2, the crack is stopped by metal solid pattern 25 formed in bonding area 2c, and prevented from reaching internal wiring 14b formed in the lower layer. In order to simplify the figure, the metal solid pattern is not hatched in FIG. 6.

As shown in FIG. 6, metal solid pattern 25 is a conductor pattern formed on element-mounting surface 2a serving as the surface of first layer substrate 21a, similar to wiring 14a. Metal solid pattern 25 can be formed as one pattern simultaneously to wirings patterned on the surface of first layer substrate 21a. Length d4 of metal solid pattern 25 from a position directly under point P of the end position of adhesive agent 6 towards semiconductor element 1 may be determined such that metal solid pattern 25 covers direction F of the maximum shear stress from point P. Based on the above study of distance d3, distance d4 preferably satisfies $d4 > \sqrt{3}d1$, and more preferably, may satisfy $d4 > 2d1$. The maximum value of distance d4 may be a value ensuring insulation between metal solid pattern 25 and wiring 14a.

Metal solid pattern 25 having the above dimension has a predetermined margin in direction F of the maximum shear stress from point P. Even when a crack is generated in protective film 24 formed on first layer substrate 21a can be stopped and is effectively prevented from reaching, e.g., internal wiring 14b. Thus, in the semiconductor device including metal solid pattern 25 shown in FIG. 6, even when the crack is generated in protective film 24 from the end of adhesive agent 6 towards semiconductor element 1, this crack can be prevented from directly affecting internal wiring 14b, so that it is especially effective when the distance d2 in FIG. 5 between adhesive agent 6 and internal wiring 14b cannot be sufficiently ensured due to a limitation in thickness of first layer substrate 21a.

In addition, metal solid pattern 25 is only arranged from the end of adhesive agent 6 toward the side of the arrangement position of semiconductor element 1 in the example shown in FIG. 6, but metal solid pattern 25 may be formed unitarily with metal solid pattern 16 formed directly under a region which has adhesive agent 6 applied thereto and is denoted by a broken line shown in FIG. 6. In this case, metal solid pattern 16 has an effect of absorbing and alleviating the stress itself generated by adhesive agent 6, and metal solid pattern 25 has an effect of stopping the crack in protective film 24.

In above description, the relationship of the preferred arrangement positions of wiring 14 to bypass bonding area 2c in the semiconductor device according to this embodiment shown in FIG. 3 is explained. Further, similarly to the structure shown in FIG. 4, package substrate 2 may include base material 22 which has the strength higher than the other parts and which is located at the center in its thickness direction (in plan view), and internal wiring 14b may be formed in lower layer 23 opposite to the surface 2a about base material 22, a crack is not likely to reach internal wiring 14b from element-mounting surface 2a. Therefore, as shown in FIG. 4, in the case that package substrate 2 has a three-layer structure including base material 22 at the center in the thickness direction, and internal wiring 14b is formed in lower layer 23, as long as distance d3 which defines the positional relationship of wiring 14a formed on element-mounting surface 2a is within the desired range, wiring 14 is effectively prevented from being cut due to the stress generated by the thermal expansion of heat dissipating plate 4.

In addition, from a reverse point of view, the preferable condition of wiring 14 which bypasses the part having adhesive agent 6 applied thereto to bond heat dissipating plate 4 shown as formulae 1 and 2 is applicable not only to the three-layer structure of package substrate 2 having base material 22 in the center in the thickness direction shown in FIGS. 3 and 4, but also to an ordinary laminated substrate having two or more layers, as the preferable condition.

As described above, according to the above consideration with reference to FIGS. 5 and 6, the position of wiring 14 at the end of bonding area 4c of package substrate 2 at an inner side having semiconductor element 1 mounted thereto is considered. Bonding part 4b of heat dissipating plate 4 is bonded to the end of bonding area 4c. Since center part 4a of heat dissipating plate 4 is bonded to semiconductor element 1 while allowing heat conduction, heat dissipating plate 4 thermally expands outward. Adhesive agent 6 is bonded to protective film 24 formed on package substrate 2 at the bonding part. The stress caused by the difference in thermal expansion coefficient from package substrate 2 is strongly applied to the inner end of the bonding part towards semiconductor element 1.

Meanwhile, as for a distance between an end of adhesive agent 6 opposite to semiconductor element 1 and an end of wiring 14c serving as the surface wiring on element-mounting surface 2a to which wiring 14 returns after bypassing bonding area 2c of package substrate 2 through internal wiring 14b, since a direction in which the stress is applied is different, the condition shown as formula 1 or 2 is not applied thereto entirely. However, since the stress pulling adhesive agent 6 outward is applied to adhesive agent 6 as shown by white arrow D shown in FIG. 5, this stress has an effect on the contact part between the protective film which are not shown in FIG. 5 and the end of adhesive agent 6 opposite to semiconductor element 1, that is, the right end thereof. Therefore, it is considered that the end of wiring 14c formed on element-mounting surface 2a and the end of adhesive agent 6 opposite to semiconductor element 1 are preferably spaced with a certain distance without overlapping with each other in the thickness direction of package substrate 2 (in plan view) in order to prevent wiring 14c from being cut.

Figure 7:
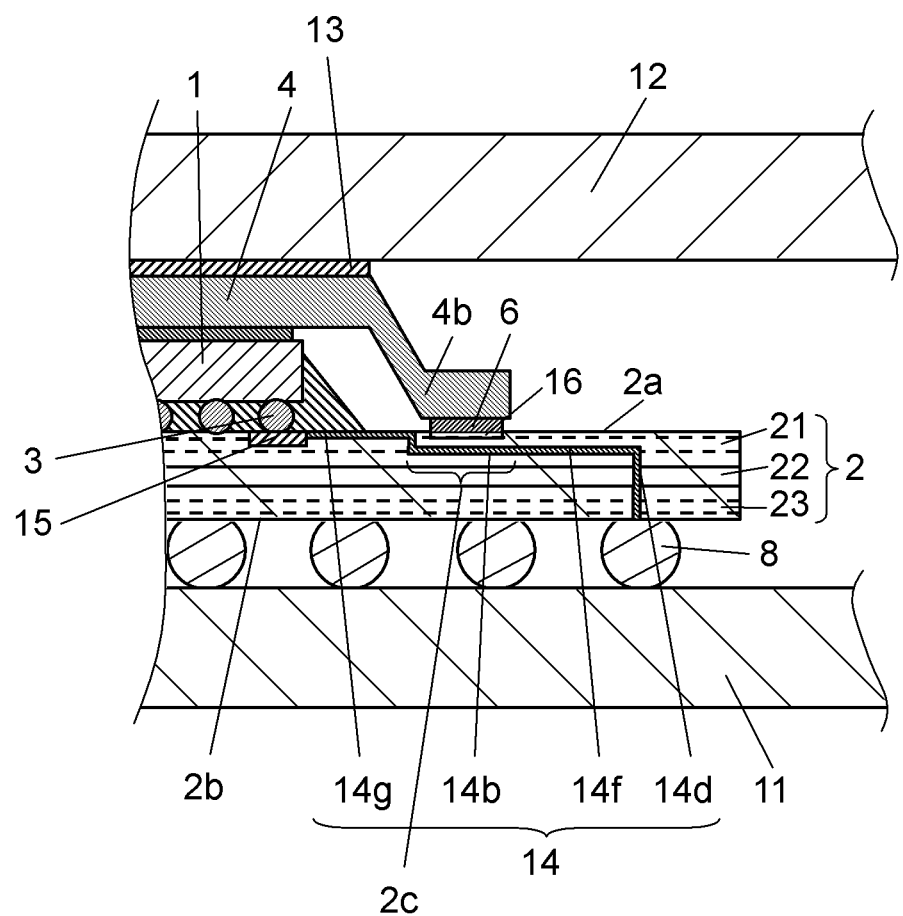
FIG. 7 is a schematic cross-sectional view of the semiconductor device according to the second embodiment of the invention for illustrating a first modification of the position of the wiring formed on the package substrate.

FIG. 7 is a cross-sectional view of a first modification of the semiconductor device according to this embodiment configuration in the arrangement of wiring 14 formed at package substrate 2.

In the first modification of the semiconductor device in the arrangement wiring 14 shown in FIG. 7, wiring 14 is connected to connection electrode 15 which is formed on element-mounting surface 2a of package substrate 2 and which is connected to bump electrode 3 of semiconductor element 1. Wiring 14 includes surface wiring 14a arranged on element-mounting surface 2a, internal wiring 14b formed inside package substrate 2 in bonding area 2c, penetration hole part 14d, such as a via hole, provided in package substrate 2, and wiring 14f formed inside package substrate 2 without returning to element-mounting surface 2a, and is connected to external electrode 8 formed on surface 2b of package substrate 2 opposite to element-mounting surface 2a.

Thus, even if wiring 14 connecting connection electrode 15 to external electrode 8 of package substrate 2 includes internal wiring 14f after bonding area 2c without returning to element-mounting surface 2a, wiring 14 is effectively prevented from being cracked due to the stress applied to bonding area 2c positioned on the surface of package substrate 2 since wiring 14 passes inside package substrate 2 in bonding area 2c, providing package substrate 2 with high reliability.

In FIG. 7, internal wiring 14b is formed inside upper layer 21 towards element-mounting surface 2a with respect to base material 22 of package substrate 2 as shown in FIG. 3. But as shown in FIG. 4, in the case that internal wiring 14b which bypasses bonding area 2c is formed inside lower layer 23 positioned towards surface 2b opposite to element-mounting surface 2a and penetrates base material 22 of package substrate 2 to be connected, wiring 14 can be connected to penetration hole part 14d, such as the via hole, through that layer without returning to element-mounting surface 2a.

In addition, in FIG. 7, metal solid pattern 16 is provided on the surface of bonding area 2c, but metal solid pattern 16 may be formed as needed, similar to package substrate 2 of the semiconductor device according to this embodiment, described with reference to FIGS. 3 and 4.

Furthermore, in the case that after passing through internal wiring 14b, the wiring does not return to element-mounting surface 2a, as shown in FIG. 7, it is preferable that distance d2 between internal wiring 14b and adhesive agent 6, and distance d3 between the end of wiring 14a formed on element-mounting surface 2a and the end of adhesive agent 6 towards semiconductor element 1 are determined to satisfy the preferable condition, formula 1 or 2 which has been discussed with reference to FIGS. 5 and 6 to prevent wiring 14 from being cut due to the thermal expansion of heat dissipating plate 4.

Figure 8:
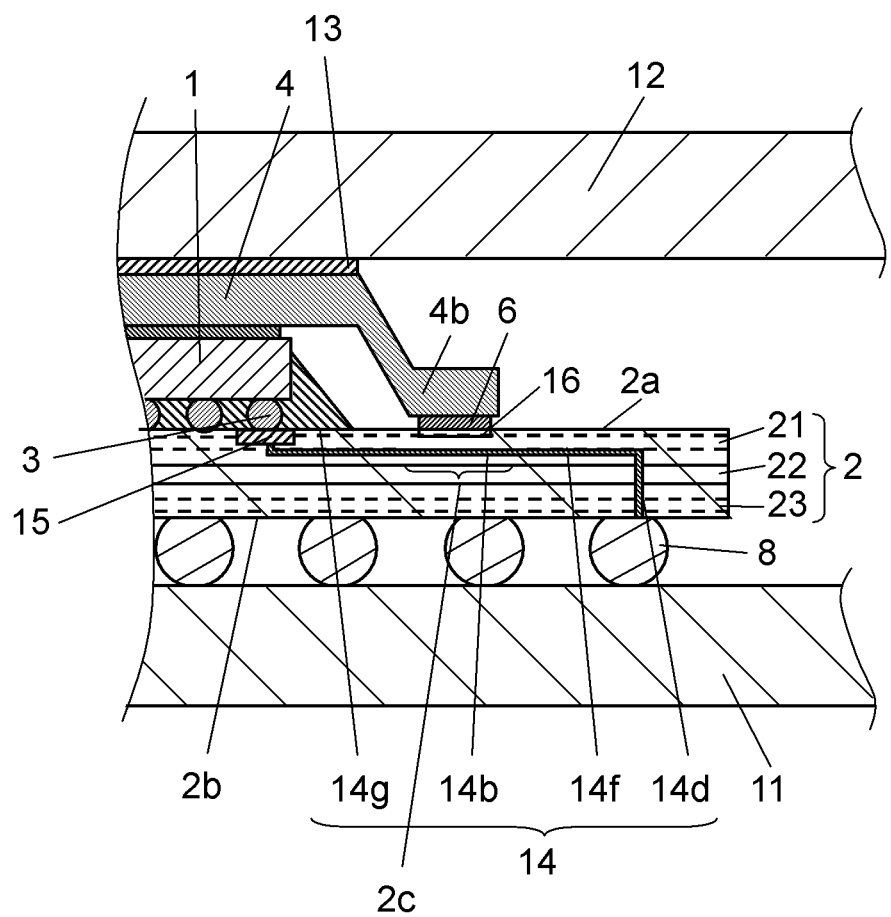
FIG. 8 is a schematic cross-sectional view of the semiconductor device according to the second embodiment of the invention for illustrating a second modification of the position of the wiring formed on the package substrate.

FIG. 8 is a cross-sectional view of a second modification of the semiconductor device according to this embodiment in the arrangement of wiring 14 formed in package substrate 2.

In the second modification of the semiconductor device having in the arrangement of wiring 14 shown in FIG. 8, wiring 14 is connected to connection electrode 15 which is formed on element-mounting surface 2a of package substrate 2 and is connected to bump electrode 3 of semiconductor element 1. Wiring 14 is connected to internal wiring 14g provided in package substrate 2 through a penetration wiring, such as a via hole. connected to connection electrode 15 without passing through element-mounting surface 2a of package substrate 2, passes through internal wiring 14b formed inside package substrate 2 in bonding area 2c, and then, passes through internal wiring 14f, is connected to penetration hole part 14d, such as a via hole, provided in package substrate 2, and is connected to external electrode 8.

Thus, even in the case that wiring 14 passes only through the internal layer of package substrate 2 without being arranged on element-mounting surface 2a of package substrate 2, wiring 14 passes through the internal layer instead of being provided on element-mounting surface 2a of package substrate 2, in bonding area 2c. Therefore, wiring 14 is not cut due to the stress caused by the difference in thermal expansion coefficient between heat dissipating plate 4 and package substrate 2 in bonding area 2c, and a conduction defect can be effectively prevented from being generated.

As shown in FIG. 8, in the case that wiring 14 does not pass through element-mounting surface 2a of package substrate 2, as for the formation position of internal wiring 14b in its depth direction, distance d1 between element-mounting surface 2a of package substrate 2 and adhesive agent 6, and distance d2 between adhesive agent 6 and internal wiring 14b preferably satisfy $d2 > 2d1$, and more preferably $d2 > \sqrt{5} d1$ according to the condition of formula 1 or 2 discussed with reference to FIG. 5.

Figure 9:
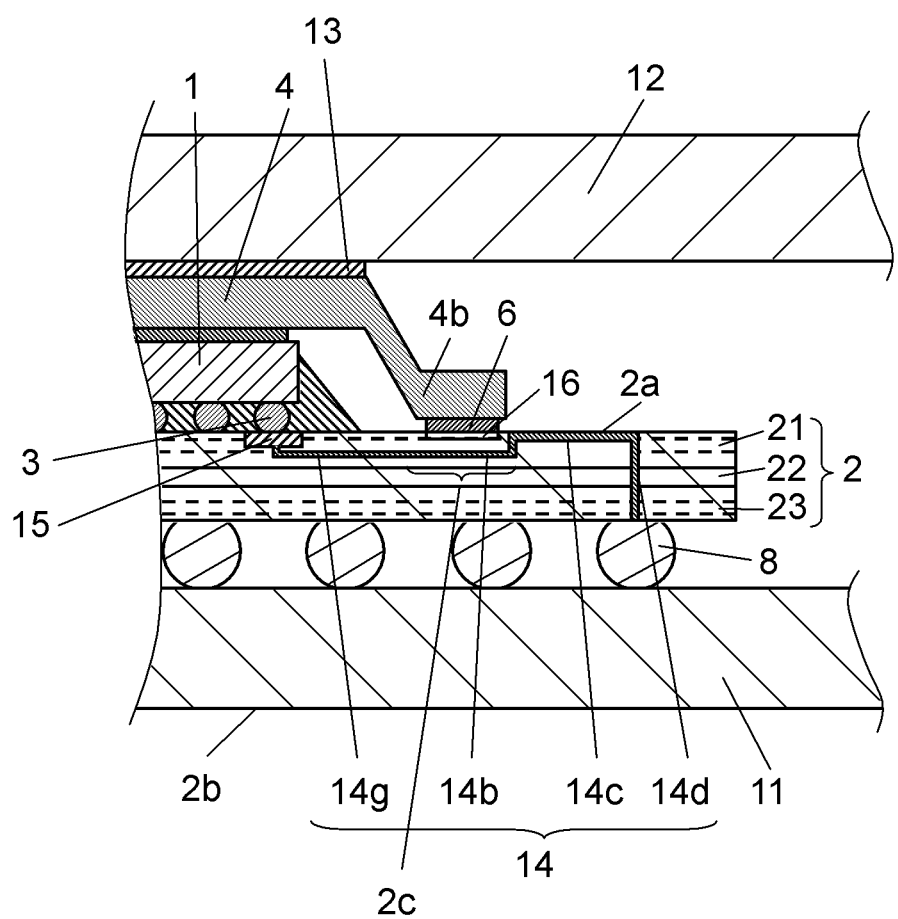
FIG. 9 is a schematic cross-sectional view of the semiconductor device according to the second embodiment of the invention for illustrating a third modification of the position of the wiring formed on the package substrate.

FIG. 9 shows a third modification the semiconductor device which is different from the second modification including wiring 14 formed on element-mounting surface 2a of package substrate 2 shown in FIG. 8. Wiring 14 is connected to connection electrode 15 connected to bump electrode 3 of semiconductor element 1. Wiring 14 passes through internal wiring 14g formed inside package substrate 2 through a penetration wiring, such as a via hole, formed so as to be connected to connection electrode 15 without passing through element-mounting surface 2a of package substrate 2, passes through internal wiring 14b in bonding area 2c, passes through wiring 14c formed on element-mounting surface 2a, and passes through penetration hole part 14d, such as a via hole, provided in package substrate 2 and external electrode 8.

In the third modification, since wiring 14 passes through the internal layer without passing through element-mounting surface 2a of package substrate 2 in bonding area 2c, similar to each configuration example shown in the above, wiring 14 is not cut by the stress caused by the difference in thermal expansion coefficient between heat dissipating plate 4 and package substrate 2 in bonding area 2c, and a conduction defect can be effectively prevented from being generated.

In the third modification shown in FIG. 9, as for the position of internal wiring 14b in the depth direction, distance d1 between element-mounting surface 2a of package substrate 2 and adhesive agent 6 and distance d2 between adhesive agent 6 and internal wiring 14b preferably satisfy $d2>2d1$, and more preferably $d2>\sqrt{5}d1$, according to the condition of formula 1 or 2 discussed with reference to FIG. 5.

In addition, as described in FIG. 5, as for the distance between the end of adhesive agent 6 opposite to semiconductor element 1 and the end of wiring 14c where wiring 14 returns to element-mounting surface 2a again after passing through internal wiring 14b in bonding area 4c of package substrate 2, the end of wiring 14c formed on element-mounting surface 2a and the end of adhesive agent 6 opposite to the position of semiconductor element 1 are preferably spaced with a certain distance preventing the end of wiring 14c from overlapping the end of adhesive agent 6 in the thickness direction of package substrate 2 (in plan view).

In addition, metal solid pattern 16 is not an essential component for the second modification of wiring 14 formed in package substrate 2 of the semiconductor device shown in FIG. 8, and for the third modification shown in FIG. 9, similar to the first modification shown in FIG. 7.

Third Exemplary Embodiment

A semiconductor device according to a third exemplary embodiment will be described with reference to FIGS. 10 to 12 particularly in the configuration of external electrode 8 formed on surface 2b of package substrate 2 opposite to element-mounting surface 2a. External electrode 8 is provided in a part where package substrate 2 and heat dissipating plate 4 are bonded to each other.

Figure 10:
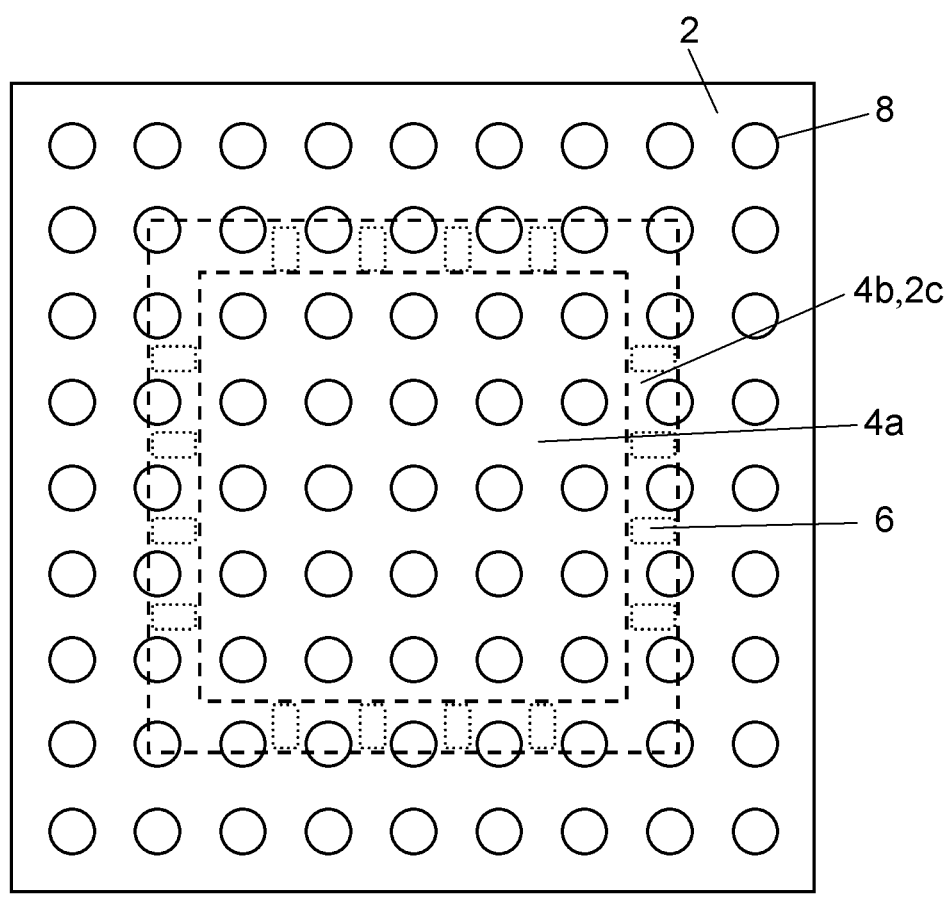
FIG. 10 is a plan view of a semiconductor device according to a third exemplary embodiment of the invention for illustrating an example of a positional relationship between an external electrode and a bonding part of a package substrate and a heat dissipating member.

FIG. 10 is a plan view of in the semiconductor device according to this embodiment for showing a positional relationship among bonding part 4b to bond heat dissipating plate 4 to package substrate 2, bonding area 2c of package substrate 2, an application part of adhesive agent 6 to bond heat dissipating plate 4 to package substrate 2, and external electrodes 8 formed on surface 2b of package substrate 2 opposite to element-mounting surface 2a.

Figure 11:
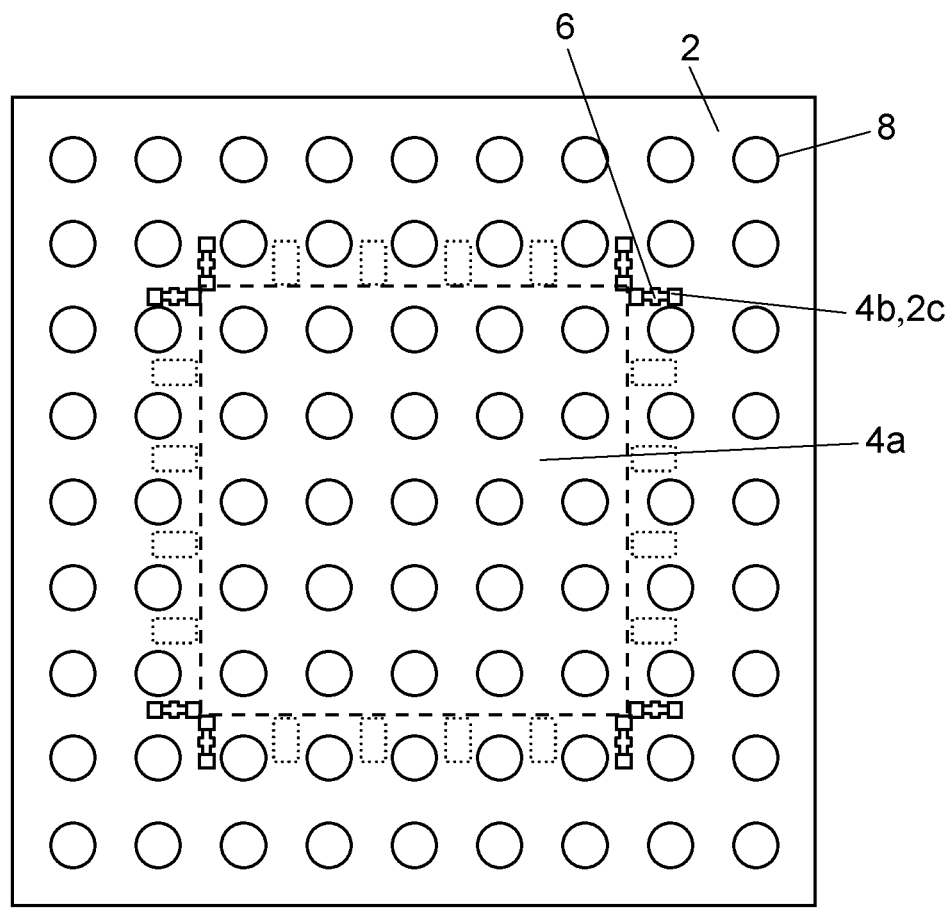
FIG. 11 is a plan view of the semiconductor device according to the third embodiment of the invention for illustrating a first modification of the positional relationship between the external electrode and the bonding part of the package substrate and the heat dissipating member.
Figure 12:
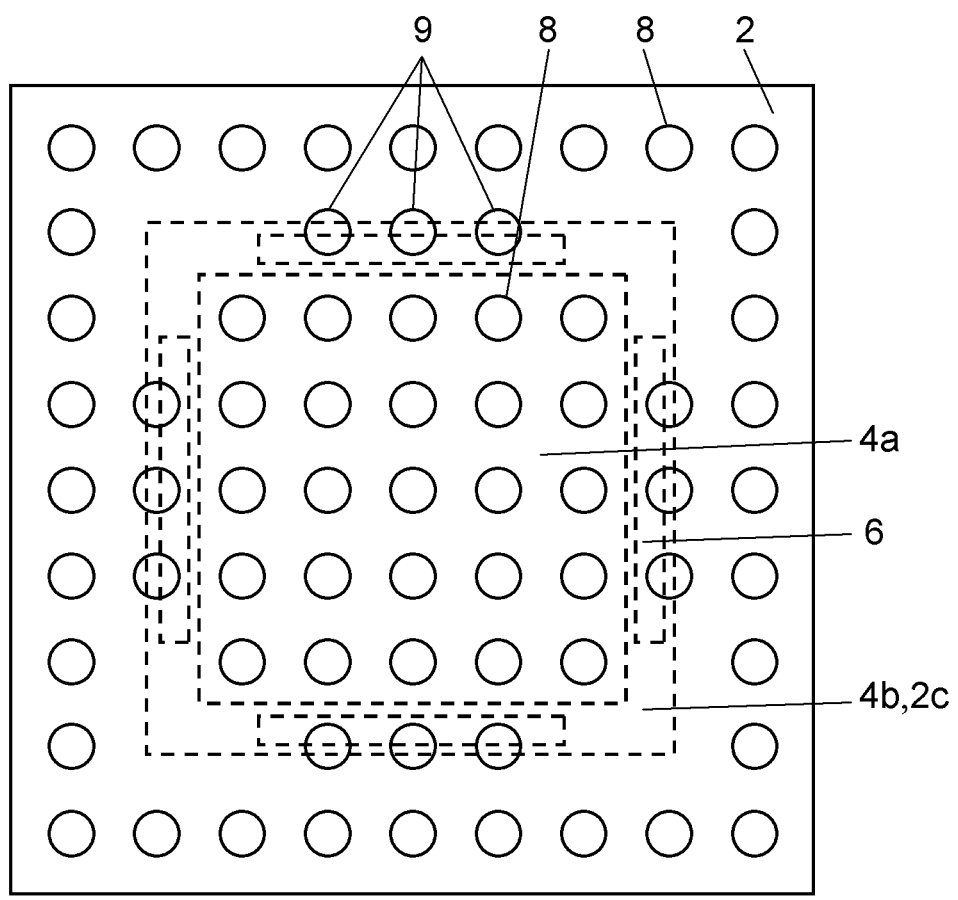
FIG. 12 is a plan view of the semiconductor device according to the third embodiment of the invention for illustrating a second modification of the positional relationship between the external electrode and the bonding part of the package substrate and the heat dissipating member.

In addition, each of FIGS. 10, 11 and 12 is a view showing the semiconductor device in the exemplary embodiment taken from the side of surface 2b of package substrate 2 on which external electrode 8 is formed, In order to prevent the drawing from becoming complicated, semiconductor element 1 and bump electrode 3 to connect semiconductor element 1 to package substrate 2 are not shown.

As shown in FIG. 10, in bonding area 2c serving as the bonding part between heat dissipating plate 4 and package substrate 2, in the semiconductor device according to this embodiment, adhesive agent 6 to bond bonding part 4b of heat dissipating plate 4 to package substrate 2 is applied to a position which does not overlap external electrode 8 in a thickness direction of package substrate 2 (in plan view).

Thus, adhesive agent 6 to bond heat dissipating plate 4 is applied to the position which does not overlap external electrode 8 in the thickness direction of package substrate 2 (in plan view). This structure positions external electrode 8 not on the back surface opposite to a part where adhesive agent 6 is applied and the stress concentration is generated by the difference in thermal expansion coefficient between heat dissipating plate 4 and package substrate 2. Therefore, external electrode 8 is prevented from being cracked due to the stress generated by the difference in thermal expansion coefficient, so that a connection defect between package substrate 2 and mount substrate 11, such as a mother board, can be prevented from being generated.

FIG. 11 is a plan view of a first modification of the semiconductor device according to this embodiment in the positional relationship between bonding part 4b of heat dissipating plate 4 and bonding area 2c of package substrate 2. The first modification shown in FIG. 11 is the same as the device shown in FIG. 10 in that a position of the part to which adhesive agent 6 is applied to bond bonding part 4b of heat dissipating plate 4 to package substrate 2 is arranged in a position not overlap external electrode 8 in the thickness direction of package substrate 2 (in plan view). Meanwhile, the first modification shown in FIG. 11 is different from the device in that bonding part 4b of heat dissipating plate 4 has a shape having a projection part corresponding to the shape of bonding area 2c of package substrate 2 so as not to overlap the position of external electrode 8.

More specifically, as shown in FIG. 11, bonding part 4b of heat dissipating plate 4 has the shape projecting outward from the vicinity of four corners of main surface part 4a of substantially-square heat dissipating plate 4 in a direction perpendicular to two sides forming the corner. Thus, adhesive agent 6 is applied to bonding parts 4b of heat dissipating plate 4 including eight projection parts in total to bond heat dissipating plate 4 to bonding area 2c of package substrate 2.

FIG. 12 is a plan view of a second modification of the semiconductor device according to this embodiment in the positional relationship between bonding part 4b of heat dissipating plate 4 and bonding area 2c of package substrate 2. The second modification shown in FIG. 12 is the same as those in FIGS. 10 and 12 described above in that adhesive agent 6 to bond bonding part 4b of heat dissipating plate 4 to package substrate 2 is applied to a position which does not overlap external electrode 8 in the thickness direction of package substrate 2 (in plan view).

Meanwhile, in the second modification shown in FIG. 12, external electrodes 8 regularly arranged in a matrix shape having rows and columns arranged in longitudinal and lateral directions in a whole surface region of back surface 2b of package substrate 2 beyond the part overlapping heat dissipating plate 4 are not formed in a position overlapping bonding part 4b of heat dissipating plate 4 in the thickness direction of package substrate 2 (in plan view), like extracted teeth. In addition, dummy electrode 9 which is not electrically connected to mount substrate 11 is formed on back surface 2b of package substrate 2 at a position overlapping, in the thickness direction of package substrate 2 (in plan view), the having adhesive agent 6 applied thereto to bond bonding part 4b of heat dissipating plate 4 to bonding area 2c of package substrate 2.

Thus, the external electrodes 8 regularly arranged on back surface 2b of package substrate 2 beyond the range overlapping heat dissipating plate 4 are not provided in the part corresponding to bonding area 2c and the application part of adhesive agent 6. In this region, dummy electrode 9 which is formed as a ball electrode having the same appearance as external electrode 8 but not electrically connected to mount substrate 11 is arranged, so that external electrode 8 required to be electrically connected to mount substrate 11 is prevented from being cracked by the stress applied due to the difference in thermal expansion coefficient between heat dissipating plate 4 and package substrate 2.

In addition, especially, in the case that dummy electrode 9 which is not electrically connected to mount substrate 11 is provided in the part overlapping adhesive agent 6 in the thickness direction of package substrate 2 (in plan view), the semiconductor device and mount substrate 11 can be strongly and uniformly connected, and concentration of the stress generated by the thermal expansion coefficient between heat dissipating plate 4 and package substrate 2 can be absorbed by dummy electrode 9 which is not required for ensuring electrical connection.

As described above, the semiconductor device according to the present invention has been described while the various exemplary embodiments are illustrated. The description has been made of the case where the semiconductor device according to each embodiment has the package substrate and the heat dissipating plate both having a square shape, but the semiconductor device of the present invention is not limited to this, and the present invention may be similarly applied to a semiconductor device in which either or both of the package substrate and the heat dissipating plate have another shape, such as a rectangle in plan view.

In addition, the description has been made of the case where one semiconductor element is mounted on the package substrate according to each embodiment, the semiconductor device of the present invention is not limited to this, and the present invention may be similarly applied to a semiconductor device in which plural semiconductor elements are flip-chip bonded on one package substrate, and these semiconductor elements are covered with one or more heat dissipating plates.

Furthermore, in the above exemplary embodiment, the description has been made of the case where the connection between the semiconductor element and the package substrate is the flip chip bonding in which the bump electrodes formed on the first main surface of the semiconductor element are connected to the connection electrodes formed on the element-mounting surface of the package substrate serving as the circuit substrate to mount the semiconductor element. However, the semiconductor device of the present invention is not limited to the configuration of the flip chip bonding, and the present invention may be applied to a semiconductor device in which the semiconductor element and the package substrate are connected by wire bonding.

Figure 13:
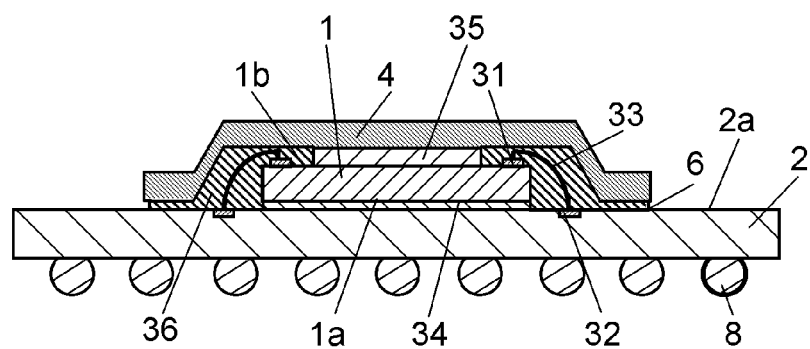
FIG. 13 is a schematic cross-sectional view of a semiconductor device in which a semiconductor element and a package substrate are connected by wire bonding.

FIG. 13 shows a semiconductor device in which semiconductor element 1 and package substrate 2 are connected by wire bonding.

As shown in FIG. 13, in the case that semiconductor element 1 and package substrate 2 are connected by wire bonding, frame terminal 31 formed on second main surface 1b of semiconductor element 1 and substrate terminal 32 formed on element-mounting surface 2a of package substrate 2 are connected with metal bonding wire 33. Semiconductor element 1 and package substrate 2 are bonded with paste 34 made of resin or metal.

In the semiconductor device in which semiconductor element 1 is connected to package substrate 2 by wire bonding shown in FIG. 13, frame terminal 31 is formed on second main surface 1b of semiconductor element 1, and bonding wire 33 connected to frame terminal 31 is positioned, so that heat dissipating plate 4 serving as a heat dissipating member cannot be bonded to a whole surface of second main surface 1b of semiconductor element 1. Thus, spacer 35 made of a metal having high thermal conductivity is arranged on a center part of second main surface 1b of semiconductor element 1, and a heat dissipating paste (not shown) is arranged on each surface of spacer 35. This structure bonds second main surface 1b of semiconductor element 1 to spacer 35 in thermally conductive, and bonds spacer 35 to heat dissipating plate 4 in thermally conductive. In this case, spacer 35 and the heat dissipating paste (not shown) applied to each surface thereof are all serve as thermally-conductive members.

Thus, the semiconductor device in which semiconductor element 1 and package substrate 2 are connected by wire bonding may be similarly applied to the area relationship between the heat dissipating member and the package substrate according to the first embodiment, the configuration in which the wiring of the package substrate is arranged in the substrate, in the bonding part between the heat dissipating member and the package substrate, and the various preferable conditions in each case according to the second embodiment, and the configuration regarding the bonding position of the heat dissipating member and the arrangement position of the external electrode and the dummy electrode in the package substrate according to the third embodiment.

In addition, the semiconductor device in which semiconductor element 1 is connected to package substrate 2 by wire bonding shown FIG. 13 can be the same as the semiconductor device in which semiconductor element 1 and package substrate 2 are connected by flip chip bonding shown in FIG. 1, in that heat dissipating plate 4 is bonded to package substrate 2 by adhesive agent 6, and external electrode 8 is formed on the surface opposite to element-mounting surface 2a of package substrate 2.

In addition, the description has been made of the case that the heat dissipating plate having a plate shape is used as the heat dissipating member to externally emit the heat of the semiconductor element according to the above exemplary embodiment, but the heat dissipating member used in the semiconductor device according to the present invention is not limited to the heat dissipating plate having the plate shape.

Figure 14:
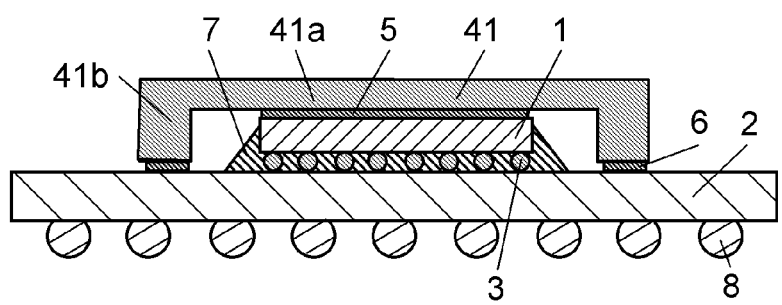
FIG. 14 is a cross-sectional view of another heat dissipating member.

For example, as shown in FIG. 14, heat dissipating member 41 having a bottomed frame shape may be arranged so as to have plate-shaped main surface part 41a, and frame-shape part 41b arranged around main surface part 41a, and projecting in a direction substantially perpendicular to main surface part 41a. As shown in FIG. 14, in the case that heat dissipating member 41 is used, it is assumed that a stress greater than the case that the plate-shaped heat dissipating plate 4 shown in FIG. 1 is used is applied to a part in which heat dissipating member 41 is bonded to package substrate 2 by adhesive agent 6 because frame-shaped part 41b of heat dissipating member 41 is highly rigid. Therefore, it is considered more preferable to apply the configuration to protect the wiring from the stress applied by the thermal expansion of the heat dissipating member by forming the wiring inside the package substrate, in the bonding part of the heat dissipating member according to the second embodiment.

In addition, as shown in FIG. 14, in the case that the member having a certain thickness is used as the heat dissipating member, instead of the plate shape, when the semiconductor element and the package substrate are connected by wire bonding as shown in FIG. 13, instead of filling the gap between the semiconductor element and the heat dissipating member with the spacer of another member, a projection part projecting toward the second main surface of the semiconductor element may be provided on the main surface part of the heat dissipating member. This projection part may contact the second main surface of the semiconductor element via a thermally conductive paste.

Figure 15:
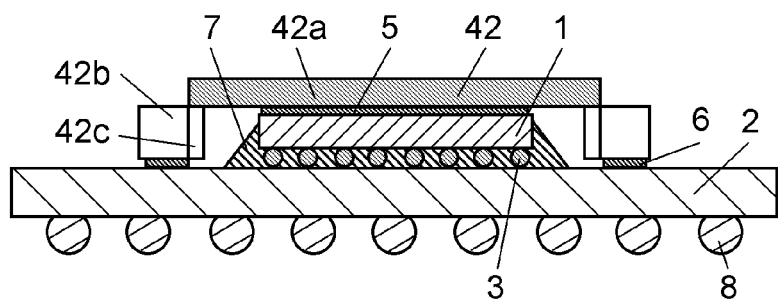
FIG. 15 is a cross-sectional view of still another heat dissipating member.

FIG. 15 is a cross-sectional view of the semiconductor device for showing another configuration example in the case where the member other than the plate-shaped member is used as the heat dissipating member.

As shown in FIG. 15, heat dissipating member 42 includes plate-shaped main surface part 42a and plate-shaped projections 42b and 42c projecting outward from four corners of plate-shaped main surface part 42a in directions perpendicular to two sides forming each corner. This configuration corresponds to the case that heat dissipating plate 4 has a three-dimensional shape in the configuration example of the semiconductor device shown in the plan view of FIG. 11.

Thus, the heat dissipating member 42 includes main surface part 42a and plate-shaped projections 42b and 42c projecting from main surface part 42a in the planar direction and in the vertical direction toward package substrate 2. This configuration ensures the area of main surface part 42a of heat dissipating member 42 sufficiently while reducing the effect of the thermal expansion of heat dissipating member 42 on the package substrate as much as possible. Therefore, while the ratio of the area of heat dissipating member 42 to the area of package substrate 2 in plan view is optimized according to the first embodiment, the heat dissipating member having the shape shown in FIG. 15 provides a design margin of the area of heat dissipating member 42 in plan view and can increase the area of heat dissipating member 42.

INDUSTRIAL APPLICABILITY

A semiconductor device according to the present invention can be applied to an ordinary semiconductor device including a heat dissipating member which contacts a semiconductor element to dissipate heat from the semiconductor element connected to a package substrate. The device can be used for information communication devices, office electronic devices, household electronic appliances, measurement apparatuses, industrial electronic devices, such as assembly robot, medical electronic device, or electronic toy.

The invention claimed is:

1. A semiconductor device, comprising:
a semiconductor element having a first surface and a second surface opposite to the first surface;
a package substrate having an element-mounting surface connected to the first surface of the semiconductor element;
a heat dissipating member including a main part and a bonding part provided at an outer periphery of the main part, the main part adheres to the second surface of the semiconductor element and the bonding part adheres to the element mounting surface of the package substrate having a contact with a portion of a bonding area of the element-mounting surface; and
a wiring electrically connected to an electrode of the semiconductor element and running below the bonding part of the dissipating member, wherein,
no portion of the wiring is provided on the element mounting surface at the portion of the bonding area.

2. The semiconductor device according to claim 1, further comprising a metal solid pattern provided on the portion of the bonding area of the element-mounting surface of the package substrate, wherein
the metal solid pattern is insulated with the wiring.

3. The semiconductor device according to claim 1, further comprising a plurality of external electrodes provided on a back surface of the package substrate opposite to the element-mounted surface, wherein
the plurality of external electrodes do not overlap the portion of the bonding area in plan view.

4. The semiconductor device according to claim 3, wherein the bonding part of the heat dissipating member includes a projection part projecting to a position which does not overlap the plurality of external electrodes in plan view.

5. The semiconductor device according to claim 3, wherein the plurality of external electrodes are arranged to have regular intervals at outside the bonding area, and arranged to have irregular intervals at the bonding area and inside the bonding area in plan view.

6. The semiconductor device according to claim 3, further comprising a dummy electrode provided on the back surface of the package substrate at a position overlapping the portion of the bonding area in plan view.

7. The semiconductor device according to claim 1, wherein an area of the heat dissipating member ranges from 41% to 64% of an area of the package substrate in plan view.

8. The semiconductor device according to claim 1, wherein a width of the bonding part of the heat dissipating member ranges from 1 mm to 3 mm.

9. The semiconductor device according to claim 1, further comprising:
a plurality of connection electrodes provided on the element-mounting surface of the package substrate; and
a plurality of bump electrodes provided on the first surface of the semiconductor element, the plurality of bump electrodes being connected to the plurality of connection electrodes by flip chip bonding.

10. The semiconductor device according to claim 1, wherein the heat dissipating member further includes a slope part connecting the main part with the bonding part.

11. The semiconductor device according to claim 1, further comprising:
an adhesive portion connecting the bonding part of the heat dissipating member with the portion of the bonding area of the element-mounting surface of the package substrate; and
a thermally-conductive member provided between the heat dissipating member and the second surface of the semiconductor element; wherein
the main part of the heat dissipating member contacts the second surface of the semiconductor element via the thermally-conductive member.

12. The semiconductor device according to claim 1, wherein the wiring has a first portion provided in an inner layer of the package substrate located directly below the portion of the bonding area.

13. The semiconductor device according to claim 12, wherein the package substrate is a laminated body including a base material, an upper layer part provided on the base material including the element mounting surface, and a lower layer part provided under the base material, and
the inner layer in which the first portion of the wiring provided is located in the upper layer part.

14. The semiconductor device according to claim 12, wherein the wiring further has a second portion which is continuous with the first portion,
the second portion is provided in the inner layer of the package substrate outside the bonding area.

15. The semiconductor device according to claim 14, wherein the wiring further has a third portion which is continuous with the first portion,
the third portion is arranged on the element-mounting surface of the package substrate inside the bonding area other than an area directly below the semiconductor element.

16. The semiconductor device according to claim 1, wherein
the wiring is provided in an internal layer of the package substrate at the bonding area, inside the bonding area, and outside the bonding area, except a portion to have a electrical contact with the electrode of the semiconductor element.

17. The semiconductor device according to claim 12, wherein
the wiring further has a second portion which is continuous with the first portion,
the second portion is provided on the element-mounting surface of the package substrate outside the bonding area.

18. The semiconductor device according to claim 17, wherein the wiring further has a third portion which is continuous with the first portion,
the third portion is arranged on the element-mounting surface of the package substrate inside the bonding area other than an area directly below the semiconductor element.

19. The semiconductor device according to claim 17, wherein the wiring further has a via through the package substrate,
the via being connected to the second portion of the wiring.

20. The semiconductor device according to claim 12, wherein the package substrate is a laminated body including a base material, an upper layer part provided on the base material including the element mounting surface, and a lower layer part provided under the base material, and
the inner layer in which the first portion of the wiring provided is included in the lower layer part.

* * * * *